United States Patent
Lim et al.

(10) Patent No.: US 6,570,253 B1
(45) Date of Patent: May 27, 2003

(54) MULTI-LAYER FILM FOR A THIN FILM STRUCTURE AND A CAPACITOR USING THE SAME

(75) Inventors: Jae-soon Lim, Seoul (KR); Yeong-kwan Kim, Seongnam (KR); Heung-soo Park, Seoul (KR); Sang-in Lee, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 2 days.

(21) Appl. No.: 09/686,623

(22) Filed: Oct. 12, 2000

(30) Foreign Application Priority Data

Oct. 19, 1999 (KR) .............................. 99-45316

(51) Int. Cl.⁷ .......................... H01G 9/04; H01G 3/075; H01L 27/108; H01L 31/119

(52) U.S. Cl. .......................... 257/758; 257/71; 257/532; 257/296; 257/300; 257/308; 257/310; 257/700; 257/701; 257/761; 257/765; 257/760; 257/759; 257/741; 257/750; 257/303; 257/311; 361/516

(58) Field of Search .......................... 257/71, 296, 298, 257/300, 280, 303, 306, 308, 341, 350, 401, 900, 901, 906, 908, 311, 304, 305, 319, 310, 758, 700, 701, 760, 759, 741, 750, 751, 532, 761, 765; 361/516

(56) References Cited

U.S. PATENT DOCUMENTS

| | | | | |
|---|---|---|---|---|
| 3,869,652 A | * | 3/1975 | Maillot | 317/230 |
| 5,262,920 A | * | 11/1993 | Sakuma et al. | 361/305 |
| 5,432,732 A | * | 7/1995 | Ohmi | 257/301 |
| 6,004,831 A | * | 12/1999 | Yamazaki et al. | 438/30 |
| 6,072,210 A | * | 6/2000 | Choi | 257/311 |
| 6,281,537 B1 | * | 8/2001 | Kim | 257/295 |
| 6,335,241 B1 | * | 1/2002 | Hieda et al. | 438/253 |
| 6,358,810 B1 | * | 3/2002 | Dornfest et al. | 438/396 |
| 6,391,801 B1 | * | 5/2002 | Yang | 438/785 |
| 2001/0023110 A1 | * | 9/2001 | Fukuzumi et al. | 438/396 |
| 2002/0011618 A1 | * | 1/2002 | Ishibashi et al. | 257/301 |

FOREIGN PATENT DOCUMENTS

| | | | | |
|---|---|---|---|---|
| JP | 5-13282 | * | 1/1993 | 361/516 |
| JP | 5-235268 | | 9/1993 | |

\* cited by examiner

*Primary Examiner*—Alexander O. Williams
(74) *Attorney, Agent, or Firm*—Lee & Sterba, P.C.

(57) ABSTRACT

A multi-layer film for a thin film structure, a capacitor using the multi-layer film and methods for fabricating the multi-layer film and the capacitor, the multi-layer film including a composition transition layer between a lower material layer and an upper material layer respectively formed of different elements whose interaction parameters are different from each other, the composition transition layer containing both elements of the lower and upper material layers, the concentration of the composition transition layer gradually varying from the portion of the composition transition layer contacting with the lower material layer to the portion of the composition transition layer contacting with the upper material layer such that the concentration of the element of the upper material layer is relatively large in its portion adjacent to the upper material layer, each of the lower and upper material layers being formed of an oxide or nitride material of aluminum, silicon, zirconium, cerium, titanium, yttrium, tantalum or niobium.

13 Claims, 4 Drawing Sheets

MULTI-LAYER FILM FOR A THIN FILM STRUCTURE AND A CAPACITOR USING THE SAME

BACKGROUND OF THE INVENTION

1. Field of the Invention

The present invention relates to a semiconductor device, and, more particularly, to a multi-layer film having an improved interface characteristic for a thin film structure, a capacitor using the multi-layer film as a dielectric, and methods for fabricating the multi-layer film and the capacitor.

2. Description of the Related Art

Multi-layer films may be employed in semiconductor devices to obtain required device characteristics. For example, a multi-layer film obtained by stacking many different kinds of material layers may be employed as a dielectric film to increase the capacitance of a capacitor. A multi-layer film, such as an oxide/nitride/oxide (ONO) film or a nitride/oxide (NO) film, can be used as a dielectric film.

Methods of stacking new dielectric materials in composite manner have been suggested for the increase of the capacitance of capacitors, required as semiconductor devices become more highly integrated.

The hetero junction interface characteristic between different kinds of material layers forming a multi-layer film may be poor, however, because the different kinds of material layers have different interaction parameters to each other. When a material is deposited on a layer of material having an interaction parameter different from the deposited material, the deposited material may be deposited unevenly.

Figure 1:
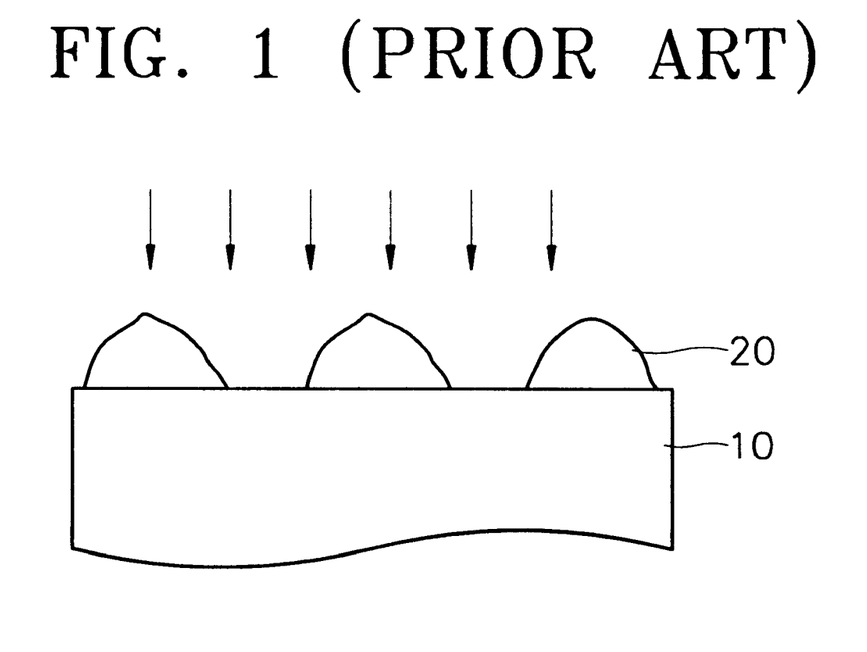
FIGS. 1 and 2 are schematic sectional views for explaining an island growth mechanism.
Figure 2:
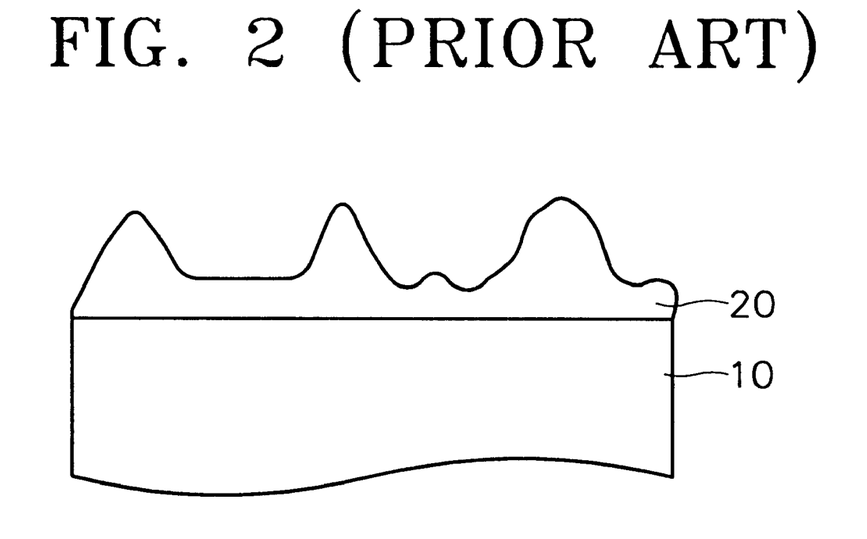

For example, a deposited of material may be deposited in the form of island growth, as shown in the schematic views of FIGS. 1 and 2 showing this mechanism of deposition. Referring to FIG. 1, when an upper material layer 20 having a different interaction parameter from that of a lower material layer 10 is deposited on layer 10, layer 20 grows out of nuclei formed by nucleation in the form of islands which stand apart from each other due to a hetero junction interface characteristic. Since the interaction parameters of layers 20 and 10 are different, the mechanism in which layer 20 nucleates from certain nucleation sites on layer 10 is applied prior to a uniform deposition mechanism in order to decrease surface energy. This deposition mechanism may be applied when layer 10 is aluminum oxide ($Al_2O_3$) and layer 20 is titanium oxide ($TiO_2$).

Referring to FIG. 2, in the upper material layer 20 in which nuclei are grown into islands, the islands meet with each other and grow into a coalesced form during deposition. Accordingly, the deposited upper material layer 20 has a very coarse or rough surface topology. As the upper material layer 20 is deposited thinner, the topology of the surface of the upper material layer 20 becomes coarser or rougher. In other words, the thickness variation of the upper material layer 20 is very nonuniform. Thus, the film characteristic of the upper material layer 20 is also very nonuniform.

Various defects may result from the film characteristic of one among the material layers forming a multi-layer film being nonuniform. For example, if one of the material layers forming a multi-layer film shows large variation in its thickness, the thickness of the entire multi-layer film may be nonuniform. When a multi-layer film is used as a dielectric, the nonuniform thickness of a material layer of the multi-layer film influences the overall dielectric constant and causes the overall dielectric constant of the multi-layer film to be nonuniform. The nonuniform dielectric constant may degrade the characteristics of a capacitor.

SUMMARY OF THE INVENTION

It is an advantage of the present invention to provide a multi-layered film having improved uniformity.

According to another aspect of the present invention, a multi-layer film for a thin film structure, the multi-layer film comprises a first layer including a first element; a second layer including a second element different from the first element; and a third layer between the first and second layers, the third layer comprising the first and second elements, wherein a concentration of the second element, in the third layer, gradually varies from a portion of the third layer contacting with the first layer to a portion of the third layer contacting with the second layer, wherein the concentration of the second element is relatively higher in the portion of the third layer adjacent to the second layer.

According to yet another aspect of the present invention, there is a method for fabricating a multi-layer film for a thin film structure. The method comprises forming an intermediate layer on a first layer having a first element; and forming a second layer on the intermediate layer, the second layer comprising a second element different from the first element, wherein the intermediate layer is comprised of both the first and second elements, wherein a concentration of the second element, the intermediate layer, gradually varies from a portion of the intermediate layer contacting with the first layer to portion of the intermediate layer contacting with the second layer so that the concentration of the second element is relatively high in the portion of the intermediate layer adjacent to the second layer.

According to yet another aspect of the present invention, there is a capacitor of a semiconductor device. The capacitor comprises a first electrode on a semiconductor substrate; a multi-layer film configured as a dielectric on the first electrode, the multi-layer film including a first layer including a first element, a second layer including a second element different from the first element, and a third layer between the first and second layers, the third layer comprising the first and second elements, wherein a concentration of the second element, in the third layer, gradually varies from a portion of the third layer contacting with the first layer to a portion of the third layer contacting with the second layer, wherein the concentration of the second element is relatively higher in the portion of the third layer adjacent to the second layer; and a second electrode on the multi-layer film.

According to yet another aspect of the present invention, there is a method for fabricating a capacitor of a semiconductor device. The method comprises forming a first electrode on a semiconductor substrate; forming a multi-layer film on the first electrode as a dielectric, the multi-layer film including a first layer including a first element, a second layer including a second element different from the first element, and a third layer between the first and second layers, the third layer comprising the first and second elements, wherein a concentration of the second element, in the third layer, gradually varies from a portion of the third layer contacting with the first layer to a portion of the third layer contacting with the second layer, wherein the concentration of the second element is relatively higher in the portion of the third layer adjacent to the second layer; and forming a second electrode on the multi-layer film.

The accompanying drawings which are incorporated in and which constitute a part of this specification, illustrate embodiments of the invention and, together with the description, explain the principles and advantages of the invention. Throughout the drawings, corresponding parts are labeled with corresponding reference numbers.

DETAILED DESCRIPTION OF THE PREFERRED EMBODIMENTS

Korean patent application number 99-45316, filed on Oct. 19, 1999 and entitled "Multi-layered film for thin film structure, capacitor using thereof and methods thereof" is incorporated in its entirety herein by reference.

Preferred embodiments of the present invention will now be described with reference to the accompanying drawings. Of course, the invention can be embodied in many different forms and should not be construed as being limited to the embodiments set forth herein. Instead these embodiments are provided so that this disclosure will be thorough and complete, and will fully convey examples of the invention to those skilled in the art. In the drawings, the thickness of layers and regions are exaggerated for clarity. When a layer is referred to as being "on" another layer or substrate, it can be directly on the other layer or substrate, or intervening layers may also be present.

In an embodiment of the present invention, a composition transition layer in which the composition therein changes is provided at an interface between different kinds of material layers when forming a multi-layer film in which different kinds of material layers are sequentially stacked. The composition transition layer includes the elements of the different kinds of material layers. The composition transition layer also has concentration degradation therein such that one portion adjacent to a lower material layer includes relatively more atoms of an element constituting the lower material layer and another portion adjacent to an upper material layer includes relatively more atoms of an element constituting the upper material layer.

The composition transition layer is provided on a lower material layer so that the dependence of an upper material layer on the lower material layer can be suppressed when the upper material layer is deposited on the lower material layer. Since the elements of the upper material layer and the elements of the lower material layer have different interaction parameters, the upper material layer shows dependence on the lower material layer. The composition transition layer, however, mitigates the difference between the interaction parameters of the upper and lower material layers. Consequently, the composition transition layer suppresses the dependence of the upper material layer on the lower material layer, thereby allowing uniform deposition.

The upper material layer is deposited on the surface of the composition transition layer which has the surface of an interaction parameter similar to that of the substance constituting the upper material layer. Consequently, the upper material layer on the composition transition layer tends to be subject to uniform deposition mechanism assisted by the same kind of interface rather than the island growth mechanism assisted by a hetero junction interface. Thus, sharp deposited surfaces can be achieved.

In an embodiment of the present invention, a method for using the multi-layer film described above as the dielectric of a capacitor in a semiconductor device is also provided. The multi-layer film is formed of uniform sub-layers for a uniform dielectric constant.

Figure 3:
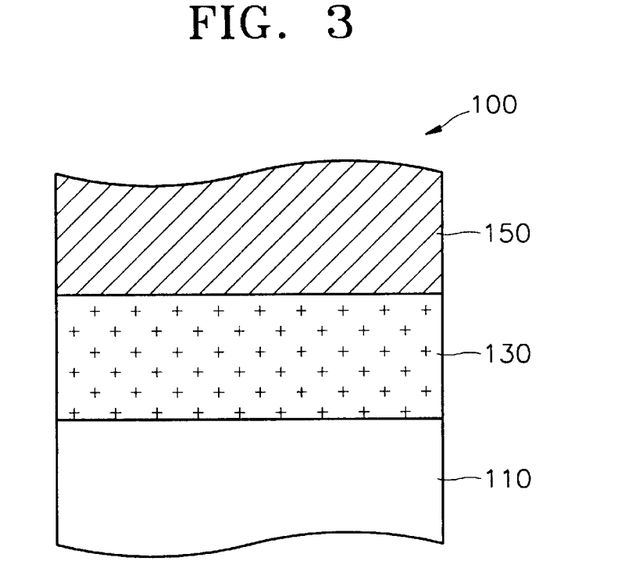
FIG. 3 is a schematic sectional view for explaining a multi-layer film according to an embodiment of the present invention.

FIG. 3 shows a multi-layer film 100 includes a lower material layer 110 and an upper material layer 150 formed of different substances respectively. For example, the lower material layer 110 may be formed of aluminum oxide and the upper material layer 150 may be formed of titanium oxide. The lower and upper material layers 110 and 150 are each formed to a thickness of from several angstroms to dozens of angstroms. Preferably, the lower and upper material layers 110 and 150 have a thickness of 2–5 angstroms.

A composition transition layer 130 is between upper material layer 150 and the lower material layer 110 to mitigate the interface characteristic between the upper material layer 150 and the lower material layer 110 formed of different kinds of materials from each other. The composition transition layer 130 functions to reduce the difference between the surface interaction parameters of upper and lower material layers 150 and 110 formed of different kinds of materials from each other. In other words, composition transition layer 130 functions as a surface active agent to reduce surface energy or interface energy.

Figure 4:
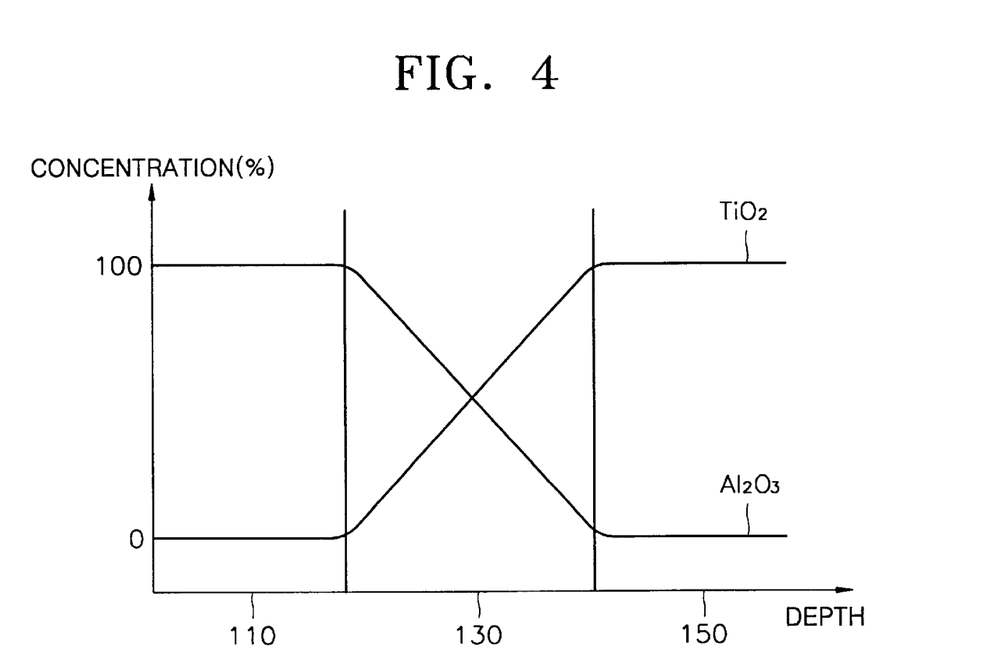
FIG. 4 is a plot showing a concentration profile in the multi-layer film of FIG. 3.

FIG. 4 shows a plot of substance concentrations in transition layer 130. The composition transition layer 130 includes the elements of both the lower and upper material layers 110 and 150 together. The concentration of each element changes according to the position in composition transition layer 130. In other words, concentration degradation in accordance with depth is adopted in composition transition layer 130.

In a structure in which composition transition layer 130 is formed at the interface between lower material layer 110 of aluminum oxide and upper material layer 150 of titanium oxide, the concentration of aluminum oxide is substantially 100% in the film of the lower material layer 110 and the concentration of titanium oxide is substantially 100% in the film of the upper material layer 150.

Composition transition layer 130 has concentration degradation in which the concentration of aluminum oxide gradually decreases from the lower material layer 110 toward the titanium oxide layer that is the upper material layer 150.

Composition transition layer 130 also has concentration degradation in which the concentration of titanium oxide gradually increases from the portion which contacts with the aluminum oxide layer that is the lower material layer 110 toward the titanium oxide layer that is the upper material layer 150. Accordingly, the composition of titanium oxide is predominant in the portion of the composition transition layer 130 contacting upper material layer 150 of a titanium oxide layer.

The surface of composition transition layer 130 is formed of titanium-rich phases including much titanium so that titanium oxide can be deposited to be primarily combined with the titanium phases predominantly distributed on the surface of the composition transition layer 130. Accordingly, a generally uniform titanium oxide layer can be formed as the upper material layer 150. In other words, the titanium oxide layer is subject to the uniform growth mechanism rather than the island growth mechanism.

Substantially, the composition transition layer 130 may be a solid solution. For example, aluminum oxide and titanium oxide can be made into a solid solution at a temperature of approximately 1010 degrees C. and at a pressure of $1.87 \times 10^{-13}$ torr or less. Accordingly, aluminum oxide and titanium oxide can be made into a solid solution by controlling temperature and pressure during a deposition process to form the composition transition layer 130.

The formation of composition transition layer 130 is described on the basis of an atomic layered deposition (ALD) method. However, other methods for obtaining the solid solution described above may be employed to form composition transition layer 130.

Figure 5:
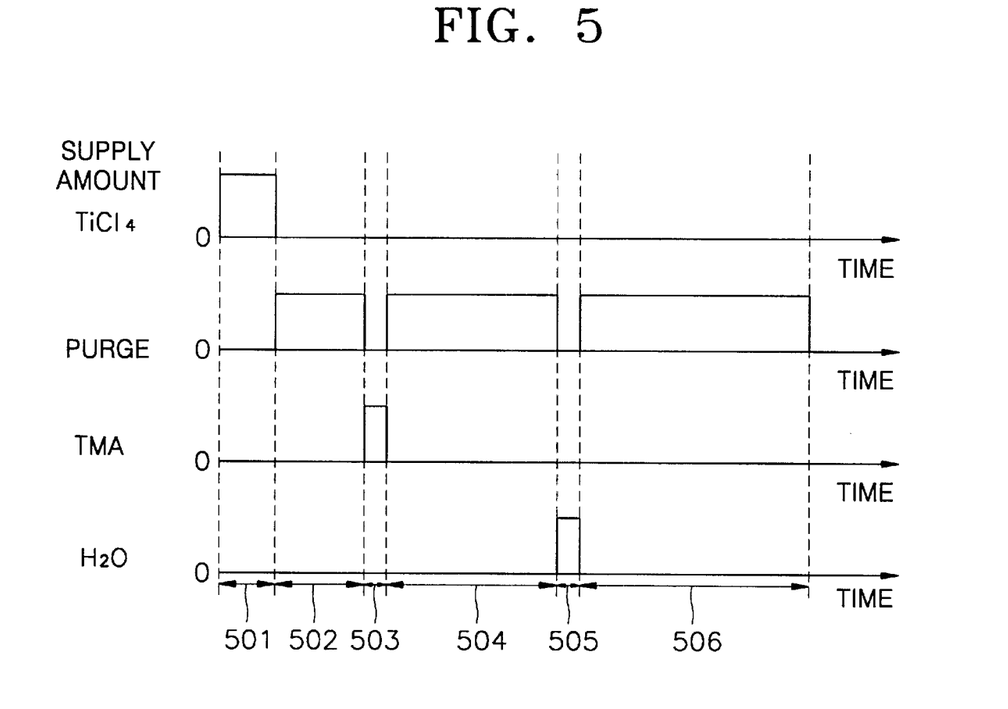
FIG. 5 is a timing diagram for explaining a method of forming a composition transition layer according to an embodiment of the present invention.

FIG. 5 shows a diagram for explaining how to make layer 130. A semiconductor substrate (not shown) having the lower material layer 110 of FIG. 3 is prepared. For example, an aluminum oxide layer deposited thinly using ALD method is used as the lower material layer 110. The aluminum oxide layer may be formed to have a thickness of from several angstroms to dozens of angstroms. The aluminum oxide layer is formed to a thickness of approximately 2–5 angstroms.

Thereafter, a titanium source, used to form titanium oxide that is the same element as that constituting the subsequent upper material layer 150, is supplied over the lower material layer 110 of an aluminum oxide layer in step 501 of FIG. 5. The semiconductor substrate may be maintained at a temperature of approximately 250–450 degrees C. for an ALD process. Preferably, the semiconductor substrate is maintained at a temperature of approximately 350 degrees C.

As the titanium source, a titanium halogen compound gas such as titanium tetrachloride ($TiCl_4$) may be used. The supply amount of titanium tetrachloride is changed according to required process variables. In this embodiment, the titanium tetrachloride is supplied over the semiconductor substrate for approximately 0.4 seconds. The supplied tetrachloride titanium is adsorbed to the aluminum oxide layer that is the lower material layer 110. The adsorption is frequently caused by chemisorption.

Thereafter, a first purge process is performed for approximately one second in step 502. A nitride ($N_2$) gas may be used as a purge gas. The nitride gas may be supplied at a flow rate of approximately 400 standard cubic centimeters per minute (sccm). Residual titanium tetrachloride that is not adsorbed is discharged during the first purge process. In other words, pumping may be performed together along the purge. In addition, the titanium tetrachloride that is physically adsorbed to the aluminum oxide layer may be discharged.

Next, an aluminum source is supplied over the surface of the aluminum oxide layer, to which the titanium tetrachloride is adsorbed, in step 503. For example, aluminum trimethyl (TMA, $Al(CH_3)_3$) or aluminum triethyl (TEA, $Al(C_2H_5)_3$) is supplied as the aluminum source used as a precursor including aluminum. The aluminum source is supplied for approximately 0.2 second in this embodiment, but this can be changed according to the variables of the ALD process.

The supplied aluminum source is adsorbed to the surface of the aluminum oxide layer that is lower material layer 110 or reacts to the adsorbed titanium tetrachloride. For example, when TMA is used as the aluminum source, some TMA is adsorbed to the surface of the aluminum oxide that is lower material layer 110, to which the titanium tetrachloride is not adsorbed. Afterwards, TMA, generally subject to chemisorption, remains on the surface of lower material layer 110. Some TMA reacts with the titanium tetrachloride which is adsorbed to the aluminum oxide layer according to the following Reaction Formula.

$$3TiCl_4+4Al(CH_3)_3 \rightarrow 3Ti(CH_3)_4+4AlCl_3(g) \qquad (1)$$

According to Reaction Formula 1, the adsorbed titanium tetrachloride is transformed into titanium tetramethyl (Ti$(CH_3)_4$) in the adsorbed state and TMA is transformed into aluminum trichloride ($AlCl_3$). The created aluminum trichloride remains in a gas phase. Accordingly, titanium tetramethyl and TMA are distributed on and adsorbed to the surface of the lower material layer 110 of the aluminum oxide layer.

Thereafter, the aluminum trichloride, which remains in a gas phase, or TMA, which remains in an unadsorbed state or in a physically adsorbed state, is discharged by a second purge process in step 504. The second purge process of the step 504 progresses similarly to the first purge process of the step 501, but purging may be performed for a different length of time. For example, the second purge process is continued for approximately 2 seconds in this embodiment.

Next, an oxidizing agent is supplied as a reactant in step 505. For example, water vapor ($H_2O$) is supplied for approximately 0.2 seconds. The water vapor may react with the TMA and the titanium tetramethyl, which are adsorbed to the lower material layer 110, according to the following Reaction Formula 2.

$$Ti(CH_3)_4+2Al(CH_3)_4+5H_2O \rightarrow TiO_2(s)+Al_2O_3(s)+10CH_4 \qquad (2)$$

In other words, the adsorbed TMA and titanium tetramethyl react with the water vapor and each is transformed into an oxide. For example, the adsorbed TMA and titanium tetramethyl are transformed into a titanium oxide phase, such as titanium dioxide ($TiO_2$), and an aluminum oxide phase, such as dialuminum trioxide ($Al_2O_3$), respectively. The titanium oxide phase and the aluminum oxide phase are maintained at a deposited state on the surface of lower material layer 110.

At this time, a methane ($CH_4$) gas is produced as a reaction byproduct. To discharge the reaction byproduct, a third purge process is performed for approximately 3 seconds in step 506. Therefore, a single reaction cycle of the ALD process for forming the composition transition layer 130 is completed. A solid solution including an aluminum oxide phase and a titanium oxide phase deposited by the reaction cycle may have a thickness of approximately 0.5–3 angstroms.

Composition transition layer 130 can be grown to a desired thickness by repeating the reaction cycle. Composition transition layer 130, grown to the desired thickness, can be made to have concentration degradation by changing a purging time or a time for the supply of a titanium source in the step 501 or for the supply of an aluminum source in the step 503, namely, a pulsing time, in each reaction cycle.

Figure 6:
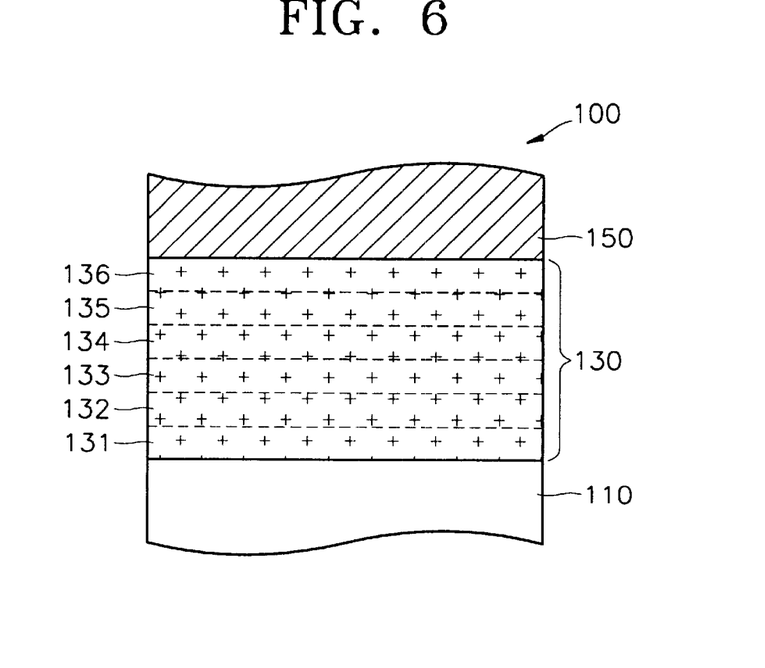
FIG. 6 is a sectional view for explaining a composition transition layer formed by repeating the reaction cycle depicted in FIG. 5.

FIG. 6 shows first composition transition sub-layer 131 formed on the lower material layer 110 by performing the reaction cycle as described above. Afterwards, second composition transition sub-layer 132 is formed on first composition transition sub-layer 131 by performing the reaction cycle under different conditions. For example, the supply amount of titanium tetrachloride may be changed by changing the length of time of the step 501 of supplying the titanium tetrachloride or the supply amount of TMA may be changed by changing the length of time of the step 503 of supplying the TMA, thereby allowing second composition transition sub-layer 132 to have a composition ratio different from that of first composition transition sub-layer 131.

After forming first composition transition sub-layer 131 according to the reaction cycle as shown in FIG. 5, the length of time of the step 501 of supplying titanium tetrachloride is increased in a reaction cycle for forming the second composition transition sub-layer 132. The length of time of the step 503 of supplying TMA is decreased. The length of time of the first purge step 502 or the second purge step 504 is also adjusted.

Accordingly, the supply amount of titanium tetrachloride is relatively increased so that the amount of titanium oxide phase or titanium is relatively increased in the resultant second composition transition sub-layer 132. In other words, in the composition of the resultant second composition transition sub-layer 132, the ratio of titanium oxide to aluminum oxide is increased compared to first composition transition sub-layer 131.

By repeating the reaction cycle while controlling related reaction variables, as described above with reference to FIG. 5, third composition transition sub-layer 133, fourth composition transition sub-layer 134, fifth composition transition sub-layer 135, and sixth composition transition sub-layer 136 may be subsequently formed such that the layers 133 through 136, respectively, have the ratios of titanium oxide to aluminum oxide sequentially increased. As a result, composition transition layer 130 is formed to have the concentration degradation shown in FIG. 4. The thickness of the composition transition layer 130 can be controlled by controlling the number of these reaction cycles for forming composition transition sub-layers.

In FIG. 5, the step 501 of supplying a titanium source precedes the step 503 of supplying an aluminum source. However, the step 503 of supplying an aluminum source may precede the step 501 of supplying a titanium source. After the step 501 of supplying a titanium source, the step 505 of supplying a reactant such as an oxidizing agent may precede the step 503 of supplying an aluminum source. In this occasion, the aluminum source, supplied during the step of supplying an aluminum source, is adsorbed to the surface of the lower material layer 110 of an aluminum oxide layer, on which a titanium oxide phase is deposited. After the step of supplying an aluminum source, the step of supplying an oxidizing agent is additionally performed to deposit an aluminum oxide phase. Consequently, composition transition sub-layers including both aluminum oxide phase and titanium oxide phase are formed.

After forming composition transition layer 130, upper material layer 150 is formed as described above with reference to FIG. 3. For example, as upper material layer 150, a titanium oxide layer is formed by the ALD method.

The portion of composition transition layer 130 contacting upper material layer 150, sixth composition transition sub-layer 136, includes much more titanium oxide than the underlying composition transition sub-layers. Accordingly, the titanium oxide layer of the upper material layer 150 is actually deposited just as it is deposited on a titanium oxide phase. Therefore, the titanium oxide layer of the upper material layer 150 is subject to the uniform growth mechanism rather than the island growth mechanism. Consequently, the upper material layer 150 is grown into a uniform film.

When using multi-layer film 100 as the dielectric of a capacitor, multi-layer film 100 may be formed such that the structure of lower material layer 110, composition transition layer 130 and upper material layer 150 is repeated.

Figure 7:
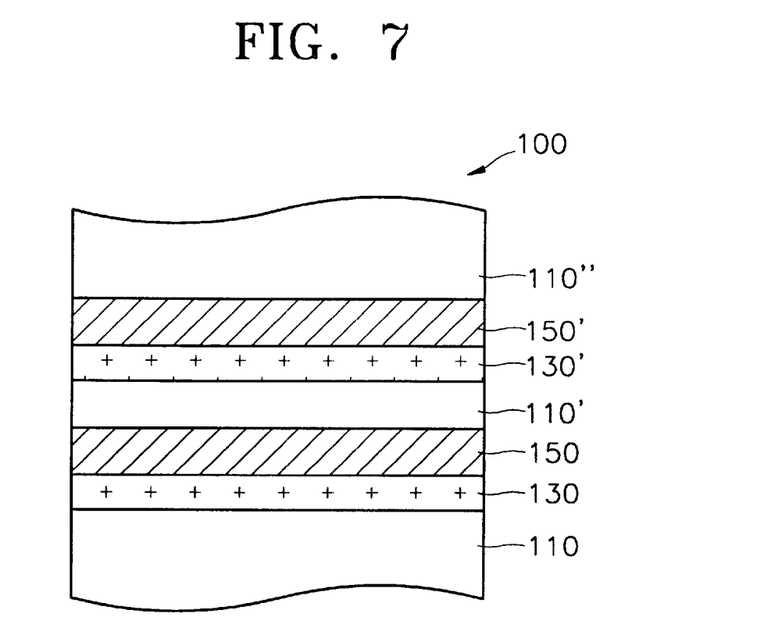
FIG. 7 is a sectional view for explaining a multi-layer film in which the structure of a lower material layer, a composition transition layer and an upper material layer is repeated according to an embodiment of the present invention.

FIG. 7 shows that the step of sequentially forming lower material layer 110, composition transition layer 130 and upper material layer 150 is repeated. Lower material layer 110 is formed of an aluminum oxide layer and upper material layer 150 is formed of a titanium oxide layer. Composition transition layer 130 is introduced between the lower and upper material layers 110 and 150. Thereafter, another lower material layer 110' of an aluminum oxide layer is formed on upper material layer 150 of a titanium oxide layer.

A different composition transition layer may be introduced between the upper material layer 150 of a titanium oxide layer and lower material layer 110' of an aluminum oxide layer. However, an aluminum oxide layer is uniformly grown on a titanium oxide layer. Accordingly, a composition transition layer may not be introduced between the upper material layer 150 of a titanium oxide layer and the lower material layer 110' of an aluminum oxide layer.

Another composition transition layer 130' is formed on the lower material layer 110' of an aluminum oxide layer. Another upper material layer 150' of a titanium oxide layer is formed on the composition transition layer 130'. Of course, another lower material layer 110" may be formed on the upper material layer 150'. Multi-layer film 100 is formed thickly by repeating the step of sequentially forming lower material layer 110, composition transition layer 130 and the upper material layer 150 as described above.

Generally, when using the multi-layer film 100 as the dielectric of a capacitor, the multi-layer film 100 may be formed to a thickness of 20–100 angstroms. Preferably, the multi-layer film 100 is formed to a thickness of 60 angstroms. Accordingly, the lower material layer 110 of an aluminum oxide layer and the upper material layer 150 of a titanium oxide layer are each formed to a thickness of several angstroms, for example, 2–5 angstroms. The composition transition layer 130 is formed to a thickness of approximately 2–5 angstroms. Accordingly, composition transition sub-layers constituting the composition transition layer 130 are each formed to a thickness of approximately 0.5–2 angstroms.

As described above, multi-layer film 100 is formed to a desired thickness by repeating the step of sequentially forming lower material layer 110, composition transition layer 130 and upper material layer 150. It is preferable to form each of the lower material layer 110, the composition transition layer 130 and upper material layer 150 to a minimum thickness at which the corresponding material maintains its unique characteristic. This is because the multi-layer film 100 used as a dielectric has a maximum dielectric constant when the thickness of each of lower material layer 110, composition transition layer 130, and upper material layer 150 is minimized.

A capacitor of a semiconductor device according to an embodiment of the present invention shows that multi-layer film 100 may be used in various applications, including the dielectric of a capacitor.

Figure 8:
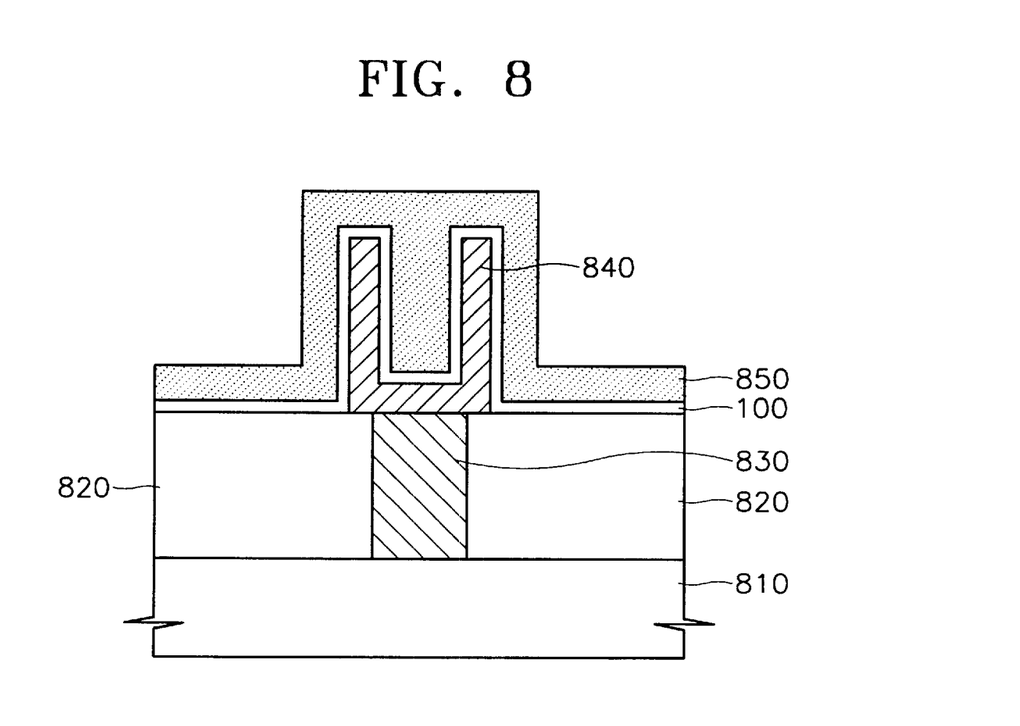
FIG. 8 is a schematic sectional view for explaining a capacitor of a semiconductor device according to an embodiment of the present invention.

Referring to FIG. 8, lower electrode 840 is formed to be insulated from semiconductor substrate 810 by insulating film 820, and electrically connected to an active region of the semiconductor substrate 810 via a conductive plug 830. Lower electrode 840 preferably has a three dimensional shape, such as the cylindrical shape shown in FIG. 8, to increase the effective area of a dielectric of a capacitor. As describe above, multi-layer film 100 is formed on lower electrode 840 as a dielectric. Multi-layered film 100 has composition transition layer 130 between two different films as shown in FIG. 3 or FIG. 7, to achieve a relatively uniform film characteristic.

When the lower material layer 110 is formed of an aluminum oxide layer and the upper material layer 150 is formed of a titanium oxide layer in the multi-layer film 100, the entire multi-layer film 100 has an enhanced effective dielectric constant. In other words, since an aluminum oxide layer is a dielectric material and a titanium oxide is a conductive material, the multi-layer film 100 realizes a higher dielectric constant than that of either an aluminum oxide layer or a titanium oxide layer. The multi-layer film 100 can realize a dielectric constant approximately three times that of either an aluminum oxide layer or a titanium oxide layer.

The multi-layer film 100 can be deposited by the ALD method as described above. Accordingly, the multi-layer film 100 shows a high step coverage characteristic caused by the characteristic of the ALD method. Therefore, although the lower electrode 840 is formed in a three dimensional structure having a high step difference, the multi-layer film 100 is uniformly deposited along the surface of the lower electrode 840. An upper electrode 850 is formed on the multi-layer film 100, thereby completing the capacitor of a semiconductor device.

In the embodiments of the present invention, an aluminum oxide layer and a titanium oxide layer are exemplified as a lower material layer and an upper material layer included in a multi-layer film. However, the lower and upper material layers may be formed of other substances. For example, each of the lower and upper material layers may be formed of an oxide or nitride material of aluminum (Al), silicon (Si), zirconium (Zr), cerium (Ce), titanium (Ti), yttrium (Y), tantalum (Ta) or niobium (Nb). The lower material layer may be formed of a different compound from that of the upper material layer. The composition transition layer formed between the lower and upper material layers includes all the compounds included in the lower and upper material layers.

According to a preferred embodiment of the present invention, a composition transition layer is formed between a lower material layer and an upper material layer of which the interaction parameters are different from each other, thereby allowing the upper material layer to have a uniform film characteristic. A multi-layer film formed by recursively stacking the lower material layer, the composition transition layer and the upper material layer is used as a dielectric of a capacitor, thereby increasing the capacitance of the capacitor.

In summary, if titanium oxide were to be deposited such that it contacts with the surface of an aluminum oxide layer, the titanium oxide would primarily subject to the island growth mechanism described above with reference to FIGS. 1 and 2. This is because titanium oxide and aluminum oxide have a very large difference in interaction parameters.

If a titanium oxide layer used as the upper material layer were to be deposited to contact with the lower material layer formed of aluminum oxide, the uniformity of a deposited film would be deteriorated so that there can occur a weak point in the deposited film. In particular, since titanium oxide is conductive, the titanium oxide is more easily deposited on and combined with titanium oxide than it is with a film such as an aluminum oxide layer, which has an insulation characteristic. Accordingly, a titanium oxide directly deposited on an aluminum layer shows a very nonuniform film characteristic and cannot even cover the surface of the aluminum oxide layer completely.

When using multi-layer film 100, which includes an aluminum oxide layer and a titanium oxide layer, as the dielectric of a capacitor in a semiconductor device, it is preferable that the aluminum oxide layer and the titanium oxide layer are formed very thinly to a thickness of 2–5 angstroms to effectively increase the capacitance. However, as described above, the titanium oxide layer is deposited according to the island growth mechanism and has a non-uniform film characteristic. This severely degrades the increase of the capacitance of a capacitor.

To address this problem, preferred embodiments of the present invention provide a multi-layer film including a composition transition layer between a lower material layer and an upper material layer respectively formed of different elements. The composition transition layer contains both elements of the lower and upper material layers. The concentration of the composition transition layer gradually varies from the portion of the composition transition layer contacting with the lower material layer to the portion of the composition transition layer contacting with the upper material layer such that the concentration of the element of the upper material layer is relatively large in its portion adjacent to the upper material layer. Each of the lower and upper material layers is formed of an oxide or nitride material of aluminum, silicon, zirconium, cerium, titanium, yttrium, tantalum or niobium. The multi-layer film is formed by repeatedly stacking the structure in which the lower material layer, the composition transition layer and the upper material layer are sequentially stacked.

The composition transition layer between the lower material layer and the upper material layer is composed of both the element constituting the lower material layer and the element constituting the upper material layer. In addition, the concentration of the composition transition layer gradually varies from the portion of the composition transition layer contacting with the lower material layer to the portion of the composition transition layer contacting with the upper material layer so that the concentration of the element constituting the upper material layer is relatively high in the portion of the composition transition layer adjacent to the upper material layer.

The composition transition layer is formed by performing a reaction cycle which includes the steps of supplying an upper material source, which includes the element constituting the upper material layer, over the lower material layer so that the upper material source is adsorbed to the lower material layer; performing a first purge process to discharge the remaining upper material source; supplying a lower material source, which includes the element constituting the lower material layer, over the lower material layer so that the lower material source is adsorbed to the lower material layer or reacts with the adsorbed upper material source; performing a second purge process to discharge the remaining lower material source and a reaction byproduct; supplying a reactant to the adsorbed upper material source or transformed upper material source by the reaction with the lower material layer and the adsorbed lower material source so as to deposit a generated material constituting the composition transition layer; and performing a third purge process to discharge a reaction byproduct produced by the reaction with the reactant.

In the step of forming the composition transition layer, the reaction cycle is repeatedly performed under different conditions that are sequentially changed as repetitions of the reaction cycle progress, so that the compositions of generated materials generated by repeating the reaction cycle are sequentially changed, whereby the composition transition layer has concentration gradation.

Since the interaction parameter of the material constituting an upper material layer is different from that of the material constituting a lower material layer, generally, a hetero junction interface is formed between the lower material layer and the upper material layer deposited on the lower material layer. Accordingly, the deposition mechanism of the upper material layer progresses to reduce surface energy caused by the hetero junction interface. In other words, the upper material layer is not uniformly deposited on the surface of the lower material layer. Instead, the upper material layer hetero-nucleates at certain nucleation sites and the nuclei are assisted in growth.

If the composition transition layer described above is formed on the lower material layer, however, the creation of the hetero junction interface can be mitigated. This is because the composition transition layer is formed such that the component of the lower material layer is predominant in the portion of the composition transition layer which contacts with the lower material layer and the component of the upper material layer is predominant around the surface of the composition transition layer which will contact with the upper material layer.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A multi-layer film for a thin film structure, the multi-layer film comprising:

a first layer including a first element;

a second layer including a second element different from the first element; and a third layer between the first and second layers, the third layer comprising the first and second elements, wherein a concentration of the second element, in the third layer, gradually varies from a portion of the third layer contacting with the first layer to a portion of the third layer contacting with the second layer, wherein the concentration of the second element is relatively higher in the portion of the third layer adjacent to the second layer.

2. The multi-layer film of claim 1, wherein the first layer includes an oxide or nitride material of the first element, and the first element is selected from the group consisting of aluminum, silicon, zirconium, cerium, titanium, yttrium, tantalum and niobium.

3. The multi-layer film of claim 1, wherein the second layer includes an oxide or nitride material of the second element, and the second element selected from the group consisting of aluminum, silicon, zirconium, cerium, titanium, yttrium, tantalum and niobium.

4. The multi-layer film of claim 1, wherein the first layer is an aluminum oxide layer and the second layer is a titanium oxide layer.

5. The multi-layer film of claim 4, wherein the third layer includes a solid solution in which a titanium oxide phase is mixed with an aluminum oxide phase.

6. The multi-layer film of claim 5, wherein the concentration of the third layer gradually varies from the portion of the third layer contacting with the aluminum oxide layer to the portion of the third layer contacting with the titanium oxide layer so that the concentration of the titanium oxide phase is relatively high in the portion the third layer contacting with the titanium oxide layer.

7. A plurality of structures, each including the multi-layer film of claim 1, the plurality of structures being sequentially stacked.

8. A capacitor of a semiconductor device, the capacitor comprising:

a first electrode on a semiconductor substrate;

a multi-layer film configured as a dielectric on the first electrode, the multi-layer film including a first layer including a first element, a second layer including a second element different from the first element, and a third layer between the first and second layers, the third layer comprising the first and second elements, wherein a concentration of the second element, in the third layer, gradually varies from a portion of the third layer contacting with the first layer to a portion of the third layer contacting with the second layer, wherein the concentration of the second element is relatively higher in the portion of the third layer adjacent to the second layer; and a second electrode on the multi-layer film.

9. The capacitor of claim 8, wherein the first layer of the multi-layer film includes an oxide or nitride material of the first element, and the first element is selected from the group consisting of aluminum, silicon, zirconium, cerium, titanium, yttrium, tantalum and niobium.

10. The capacitor of claim 8, wherein the second layer of the multi-layer film includes an oxide or nitride material of the second element, and the second element selected from the group consisting of aluminum, silicon, zirconium, cerium, titanium, yttrium, tantalum and niobium.

11. The capacitor of claim 8, wherein the first layer is an aluminum oxide layer, the second layer is a titanium oxide layer, and the third layer includes a solid solution in which a titanium oxide phase is mixed with an aluminum oxide phase.

12. The capacitor of claim 11, wherein the concentration of the third layer gradually varies from the portion of the third layer contacting with the aluminum oxide layer to the portion of the third layer contacting with the titanium oxide layer so that the concentration of the titanium oxide phase is relatively high in the portion the third layer contacting with the titanium oxide layer.

13. The capacitor of claim 8, further including a plurality of second multi-layer films between the first and second electrodes, each second multi-layer film including a first layer including a first element, a second layer including a second element different from the first element, and a third layer between the first and second layers, the third layer comprising the first and second elements, wherein a concentration of the second element, in the third layer, gradually varies from a portion of the third layer contacting with the first layer to a portion of the third layer contacting with the second layer, wherein the concentration of the second element is relatively higher in the portion of the third layer adjacent to the second layer.

* * * * *